United States Patent [19]

Nakanishi et al.

[11] 4,395,652

[45] Jul. 26, 1983

[54] ULTRASONIC TRANSDUCER ELEMENT

[75] Inventors: Toshiharu Nakanishi, Kamakura; Miyo Suzuki, Fujisawa; Hiroji Ohigashi, Zushi, all of Japan

[73] Assignee: Toray Industries, Inc., Japan

[21] Appl. No.: 186,258

[22] Filed: Sep. 11, 1980

[30] Foreign Application Priority Data

Sep. 13, 1979 [JP] Japan ............................ 54-116654
Sep. 13, 1979 [JP] Japan ............................ 54-116656

[51] Int. Cl.[3] ............................ H01L 41/02

[52] U.S. Cl. ............................ 310/334; 310/800; 367/150

[58] Field of Search ............ 310/334, 335, 367, 369, 310/800; 73/632, 642; 367/150, 157, 164

[56] References Cited

U.S. PATENT DOCUMENTS

| | | | |
|---|---|---|---|
| 2,438,936 | 4/1948 | Mason | 367/150 |
| 2,875,355 | 2/1959 | Petermann | 310/334 |
| 3,390,399 | 6/1968 | Leonard | 350/452 |
| 3,816,774 | 6/1974 | Ohnuki et al. | 310/367 |
| 4,056,742 | 11/1977 | Tibbetts | 310/800 |
| 4,084,582 | 4/1978 | Nigam | 73/642 |
| 4,284,921 | 8/1981 | Lemonon et al. | 310/329 |

*Primary Examiner*—J. D. Miller
*Assistant Examiner*—D. L. Rebsch

[57] ABSTRACT

An ultrasonic transducer element includes a polymer piezoelectric film having a plurality of sections. The sections are defined by wave planes of ultrasonic waves having substantially λ/2 phase difference emanated from an imaginary focal point or line located in front of the piezoelectric film. λ is the wave length of the ultrasonic waves within an acoustic transmission medium located between the piezoelectric film and the imaginary focal point or line. The sections are arranged so that ultrasonic waves emanated from adjacent sections have substantially no phase difference at the imaginary focal point or line. Front and rear electrodes are deposited on opposite surfaces of the piezoelectric film.

6 Claims, 12 Drawing Figures

ULTRASONIC TRANSDUCER ELEMENT

BACKGROUND OF THE INVENTION

The present invention relates to ultrasonic transducer element, and more particularly relates to an improved construction of a focus-type ultrasonic transducer element including a polymer piezoelectric film operating as a transmitter and/or receiver of ultrasonic waves.

Various types of focus-type ultrasonic transducer elements have been proposed. In one example, the sonic wave emanative surface is formed in a cylindrical or concave pattern. In another example, a plurality of ultrasonic transmitter elements are arranged on a flat surface and drive phases of the elements are chosen so that sonic waves emanated from the elements are focussed upon a fixed point in front of the transducer element with mutual interference.

These conventional transducer elements, however, are in general complicated in construction, difficult in manufacturing and high in cost. In particular, complicated process and arrangement are required for driving the transducer elements for generation of ultrasonic waves.

SUMMARY OF THE INVENTION

It is one object of the present invention to provide a focus-type ultrasonic transducer element which is simple in construction, easy in manufacturing and low in cost.

It is another object of the present invention to provide a focus-type ultrasonic transducer element which requires simple process and arrangement for driving same for generation of ultrasonic waves.

The focus-type ultrasonic transducer element in accordance with the present invention is constructed on the basis of a technical concept which is quite different from that used for construction of most conventional focus-type ultrasonic transducer elements.

In accordance with the basic technical concept of the present invention, a polymer piezoelectric film accompanied with front and rear electrode is divided into sections defined by wave planes emanated from an imaginary focal point or line located in front of the polymer piezoelectric film with a phase difference of $\lambda/2$, $\lambda$ being the wavelength of the ultrasonic waves within an acoustic transmission medium located between the film surface and the imaginary focal point or line, and the sections are arranged so that ultrasonic waves emanated from adjacent sections have no phase difference at the imaginary focal point or line.

DESCRIPTION OF THE PREFERRED EMBODIMENTS

The basic technical concept of the present invention will hereinafter be explained in more detail in reference to FIGS. 1 through 3.

Figure 1:
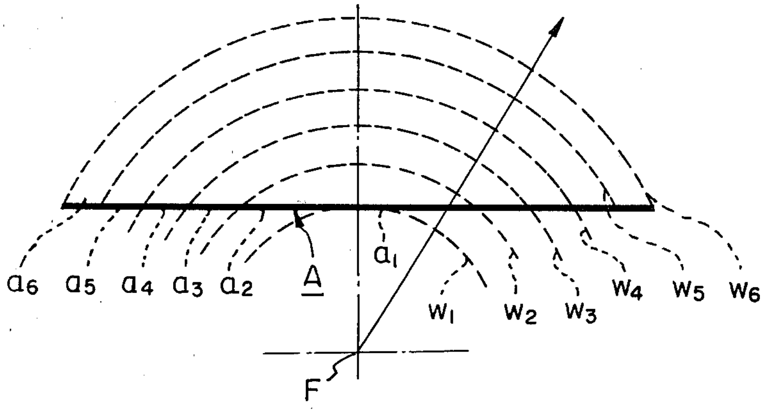
FIGS. 1 through 3 are schematic views for explaining the basic technical concept of the present invention.

In FIG. 1, the point "F" indicates the imaginary focus point for sonic waves, or the imaginary focus line for sonic waves which is thought of as extending normal to the page. Further, "A" indicates a polymer piezoelectric film used as an ultrasonic transmitter element.

It is assumed that ultrasonic waves are emanated from the imaginary focus point or line F, whose wavelength is equal to $\lambda$ in an acoustic transmission medium such as air, water or the human body. Wave planes $W_1$, $W_2$, $W_3$, $W_4$, $W_5$ and $W_6$ are shown in the illustration at an equal interval (phase difference) of $\lambda/2$, and sections of the polymer piezoelectric film A defined by adjacent wave planes are marked $a_1$, $a_2$, $a_3$, $a_4$, $a_5$ and $a_6$. More generally, a section of the polymer piezoelectric film A defined by the wave planes $W_i$ and $W_{i+1}$ (i=0, 1, 2, 3, 4 and 5) is marked $a_{i+1}$.

Figure 2:
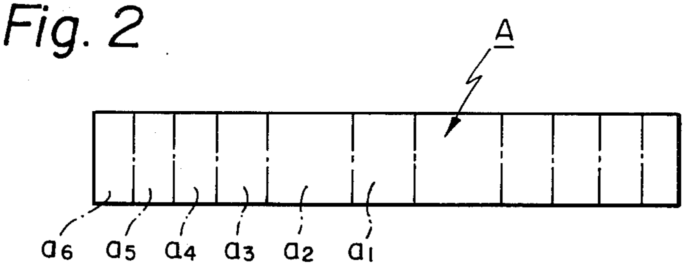
Figure 3:
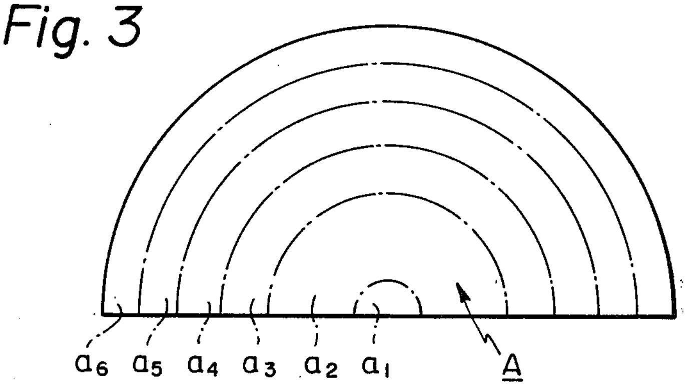

FIG. 2 depicts the plan view of a parallel-stripe-type polymer piezoelectric film A having rectangular sections and FIG. 3 depicts the plan view of a concentric-stripe-type polymer piezoelectric film A, each including the sections $a_1$, $a_2$, $a_3$, $a_4$, $a_5$ and $a_6$ defined by the wave planes of $\lambda/2$ phase difference emanated from the focus point or line F.

Next, electrodes are disposed on both surfaces of the polymer piezoelectric film A having the above-described sections, and the sections are driven for transmission of ultrasonic waves in conventional manner. Then, a phase difference $\lambda/2$ exists between the wave planes emanated from the sections $a_1$ and $a_2$, respectively, and the ultrasonic waves from these sections substantially attenuate each other at the focus point or line F due to such a phase difference. In contrast to this, a phase difference $\lambda$ exists between the wave planes emanated from the sections $a_1$ and $a_3$, respectively, and the ultrasonic waves from these sections substantially intensify each other at the focus point or line F due to such a phase difference. More generally, ultrasonic waves from the sections $a_j$ and $a_{j+1}$ (j=1, 2, 3, 4 and 5) attenuate each other and ultrasonic waves from the sections $a_j$ and $a_{j+2}$ intensify each other, both at the focus point or line F.

The basic technical concept of the present invention departs from of such a transmission mechanism of the conventional ultrasonic transducer element. That is, in accordance with the mechanism of the present invention, the ultrasonic waves emanated from the sections $a_1$, $a_2$, $a_3$, $a_4$, $a_5$ and $a_6$ should all intensify each other at the focus point or line F. In other words, the wave planes of these ultrasonic waves should have substantially no phase difference at the focal point or line F.

More specifically, with the basic construction of a polymer piezoelectric film in which ultrasonic waves emanated from a unit composed of sections $a_j$ and $a_{j+1}$ have a phase difference $\lambda/2$ at the focus point or line F, the ultrasonic waves emanated from one of the sections $a_j$ and $a_{j+1}$ in accordance with the present invention are rendered to have a further phase difference $\lambda/2$ with respect to the ultrasonic waves emanated from the other of the sections $a_j$ and $a_{j+1}$ so that the total phase difference at the focal point or line F is equal to $\lambda$. Thus, in accordance with the present invention, there should substantially be no phase difference at the focal point or line F between the ultrasonic waves emanated from any unit composed of sections $a_j$ and $a_{a+1}$.

Substantial absence of phase difference requires no particular phase adjustment of ultrasonic waves emanated from different sections by means of electronic circuits. In other words, it is no longer necessary to electrically and acoustically separate different sections by means of insulators and to supply a lead to each section for driving purposes.

In accordance with the present invention, common electrodes can be used for a number of sections of an ultrasonic transmitter element including one or more units of the sections, and ultrasonic waves can be focussed upon a desired focus point or line F by driving the sections at a same phase. When compared with the conventional cylindrical or concave type transducer element, a transducer of the present invention is by far closer to flat in its surface pattern. Further, the transducer element of the present invention is quite free of the conventional structural complications that requires use of a number of leads, division of electrodes and separation of piezoelectric elements.

The following embodiments show practical expedients which render ultrasonic waves from one of the sections $a_j$ and $a_{j+1}$ to have the above-described further phase difference $\lambda/2$ with respect to those from the other of the sections $a_j$ and $a_{j+1}$, the expedients being roughly classified into two major groups as follows.

In the case of the first group, the distances from adjacent sections $a_j$ and $a_{j+1}$ to the imaginary focus point or line F have a difference equal to $n\lambda$ ($n$=integer). In other words, the adjacent sections $a_j$ and $a_{j+1}$ are located so that their distances to the imaginary focus point or line F have a difference equal to $n\lambda$.

In the case of the second group, adjacent sections $a_j$ and $a_{j+1}$ are inverse to each other in the direction of piezoelectric polarization.

By multiplication of the above-described basic construction, a single ultrasonic transducer element of the present invention may be provided with two or more focus points or lines upon which ultrasonic waves focus.

Figure 4A:
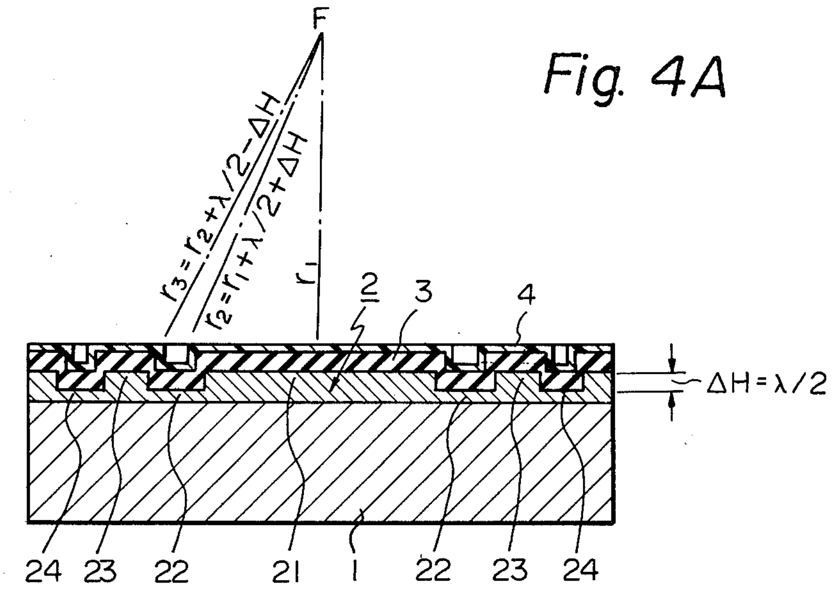
FIG. 4A is an explanatory side sectional view of one embodiment of the focus-type ultrasonic transducer element of the first-group in accordance with the present invention.
Figure 4B:
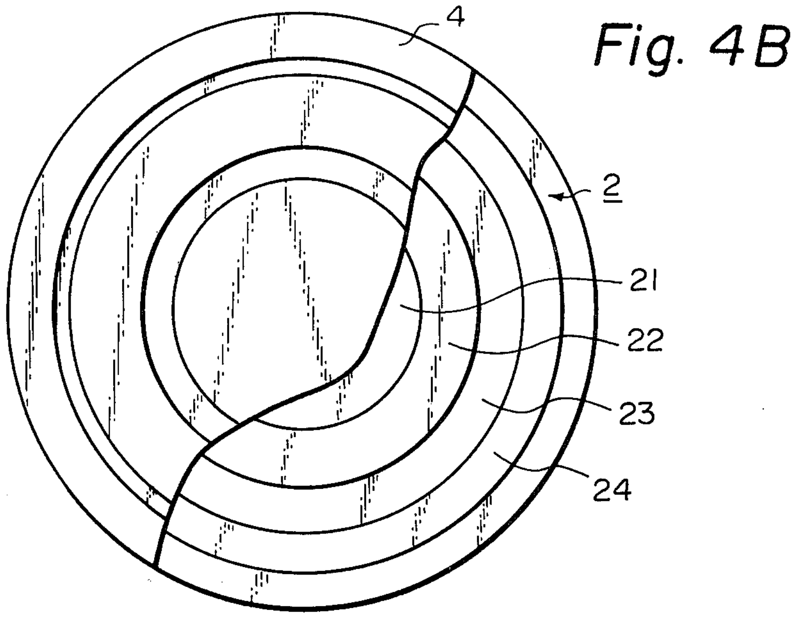
FIG. 4B is a plan view, partly cut out for easier understanding, of the transducer element shown in FIG. 4A.

One embodiment of the focus-type ultrasonic transducer element of the first group in accordance with the present invention is shown in FIGS. 4A and 4B, in which the transducer element is provided with a basically concentric construction.

The transducer element includes a substrate 1 and a rear electrode 2 arranged on the substrate 1, the rear electrode 2 operating as a reflector layer also. The front surface of the rear electrode 2 is uneven in contour and made up of alternately and concentrically arranged annular sections 21, 22, 23 and 24, odd numbers designating salient sections and even numbers hollow sections. A polymer piezoelectric film 3 and a front electrode 4 are arranged on the rear electrode 2 whilst following the surface contour of the latter.

In accordance with the present invention, the height $\Delta H$ between the salient and hollow sections, i.e. the distance between the top surface of the salient section 21 or 23 and the bottom surface of the hollow section 22 or 24, is designed equal to $\lambda/2$, $\lambda$ being the wave length of the sonic wave in the acoustic transmission medium at the frequency used. Then, assuming that the straight distance from the section 21 to the focus point or line F is equal to $r_1$, the straight distance $r_2$ from the section 22 to the focus point or line F is approximately equal to $r_1+\lambda/2+\Delta H$ and the straight distance $r_3$ from the section 23 to the focus point or line F is approximately equal to $r_2+\lambda/2-\Delta H=r_1+\lambda$. More generally, the difference in distance to the focus point or line F between adjacent sections of same surface contour, for example between the sections 21 and 23 or 22 and 24, is equal to $\lambda$. That is, the phase difference between ultrasonic waves emanated from adjacent sections of same surface contour is equal to a single wave length.

Consequently, even when the electrodes are driven in same phase, the ultrasonic waves intensify each other at the focus point or line F. This outcome is quite the same as that of the conventional focus-type transducer element in which adjacent annular sections are separated from each other and electrodes having complicated leads are driven in inverse phase. It should be appreciated greatly that no separation of electrodes is required in the case of the present invention.

This advantage also results from the excellent nature of polymer piezoelectric films such as high flexibility, homogeneity and workability which cannot be expected for inorganic piezoelectric elements.

The substrate 1 is preferably made of a polymer of low acoustic impedance such as polymethyl methacrylate, polyethylene terephthalate, nylon and epoxy resins. The rear electrode 2 is made of a metal foil such as Cu and Al. The reflector layer may be made separately from the rear electrode. The front electrode 4 is prepared by application or stream depositing of Al, Cu and Ag or coating of Ag paste to the surface of the polymer piezoelectric film 3. The polymer piezoelectric film is made of a resin material such as polyvinylidene fluoride, polyvinyl fluoride, polyvinyl chloride, polycarbonate and nylon 11.

Figure 5:
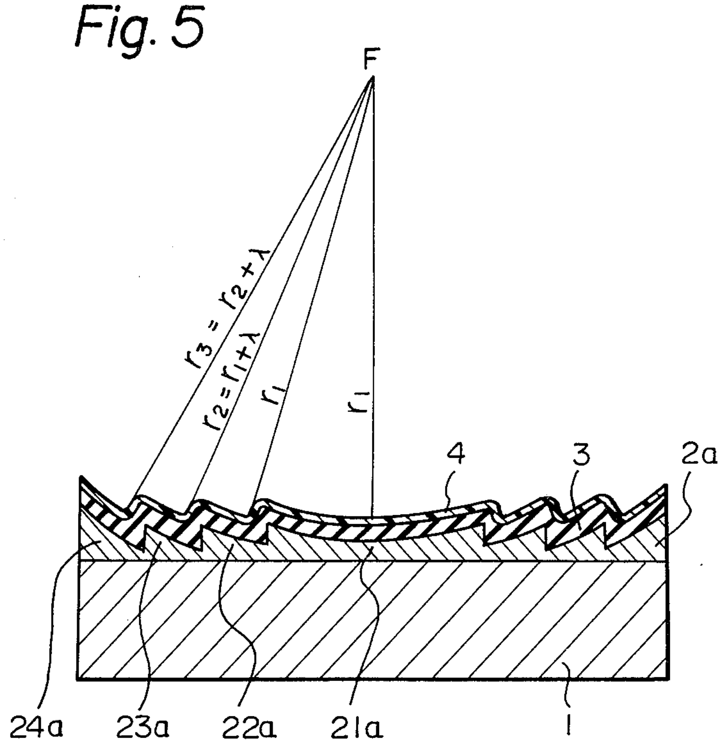
FIG. 5 is an explanatory side sectional view of another embodiment of the focus-type ultrasonic transducer element of the first-group in accordance with the present invention.

Another embodiment of the focus-type ultrasonic transducer element of the first group in accordance with the present invention is shown in FIG. 5, in which the transducer element is provided, just like the first embodiment, with a basically concentric construction. The transducer element includes a substrate 1, a rear electrode *2a* arranged on the substrate 1, a polymer piezoelectric film 3 on the rear electrode *2a*, and a front electrode 4 covering the front surface of the piezoelectric film 3.

The front surface of the rear electrode *2a* is uneven in contour and made up of concentrically arranged annular sections *21a*, *22a*, *23a* and *24a*. The section *21a* is defined by a sphere of a radius $r_1$ having its center falling on the imaginary focus point or line F, and the section *22a* is defined by a sphere of a radius $r_2=r_1+\lambda$ having its center on the focus point or line F, $\lambda$ being the wave length of the sonic wave in the acoustic transmission medium at the frequency used. Further, the section 23a is defined by a sphere of a radius $r_3=r_2+\lambda=r_1+2\lambda$ having its center on the focus point or line F, and the section 24a is defined by a sphere of a radius $r_4=r_3+\lambda=r_2+2\lambda$.

Then, the straight distance from the section 21a to the focus point or line F is equal to $r_1$, the straight distance $r_2$ from the section 22a to the focus point or line F is equal to $r_1+\lambda$, and the straight distance $r_3$ from the section to the focus point or line F is equal to $r_1+2\lambda$. More generally, the difference in distance to the focus point or line F between alternate sections, for example between the sections 21a and 22a or 22a and 23a, is equal to $\lambda$. That is, the phase difference between ultrasonic waves emanated from alternate sections as measured at the focus point or line is equal to a single wave length.

Consequently, even when the electrodes are driven in the same phase, the ultrasonic waves intensify each other at the focus point or line F. Since the sections are defined by spheres having common centers falling on the focus point or line F and the straight distance from a particular section to the focus point or line F is exactly equal to the radius of the sphere defining that particular, sonic waves from the transducer element can be better focussed upon the focus point or line F than in the first embodiment in which the straight distances are given by approximation.

In practice, however, it is difficult to form spherical surfaces on the rear electrode 2a with sufficient mechanical preciseness. Saw tooth uneven surface contour may be used as a substitute for the spherical surface contour for easier formation of the rear electrode by usual machining techniques.

Figure 6:
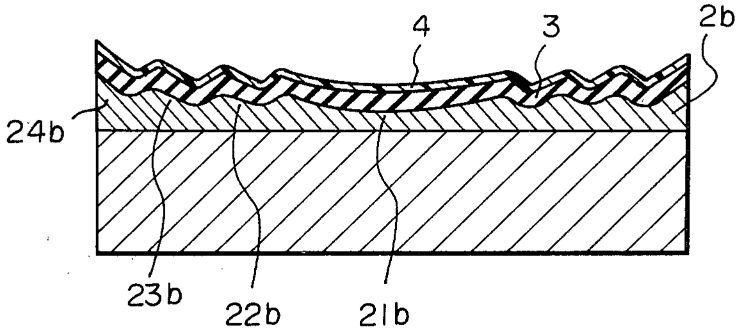
FIG. 6 is a side sectional view of the other embodiment of the focus-type ultrasonic transducer element of the first-group in accordance with the present invention.

The other embodiment of the focus-type ultrasonic transducer element of the first group in accordance with the present invention is shown in FIG. 6, in which the uneven contour of the front surface of the rear electrode 2b is substantially same as that in the second embodiment with the only exception that the sections 21b, 22b, 23b and 24b are delineated by relatively round border areas. This assures further ideal focussing of sonic waves upon the imaginary focus point or line F, and stronger, more even and more stable adhesion of the polymer piezoelectric film 3 to the front surface of the rear electrode 2b.

The explanation below is directed to the focus-type ultrasonic transducer elements of the second-group, in which adjacent sections are piezoelectrically polarized inversely to each other.

Figure 7A:
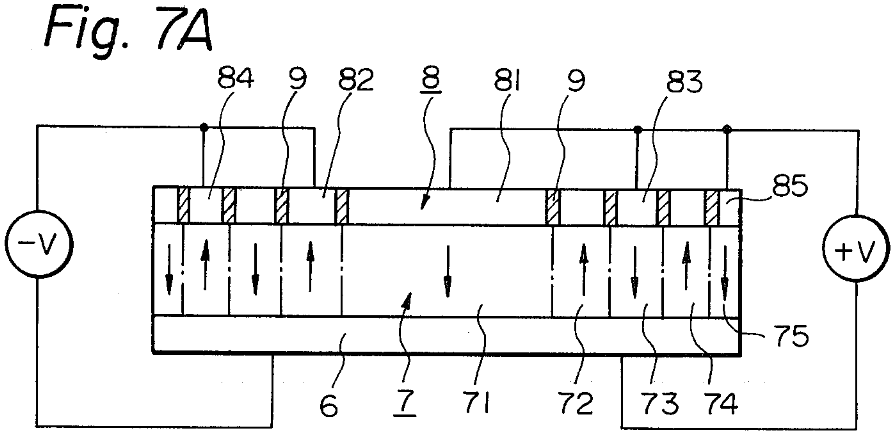
FIGS. 7A and 7B are explanatory side views of further embodiments of the focus-type ultrasonic transducer element of the second-group in accordance with the present invention.

One embodiment of the focus-type ultrasonic transducer element of the second-group is shown in FIG. 7A, in which the transducer element is provided with a basically concentric construction.

The transducer element includes a substrate (not shown in the drawing), a rear electrode 6 arranged on the substrate, a precursor 7 arranged on the rear electrode 6 and acting as a polymer piezoelectric film after polarization, and a front electrode 8 covering the front surface of the precursor 7. Further, annular insulators 9 are used for separating different sections. In the illustration, up and down arrows indicate directions of polarization in the precursor 7 after piezoelectric polarization.

The front electrode 8 is made up of concentrically arranged annular sections 81, 82, 83, 84 and 85. The odd number sections 81, 83 and 85 are electrically connected in parallel whereas even number sections 82 and 84 are connected in parallel, respectively. The sections 81, 82, 83, 84 and 85 have to be fully electrically separated by the insulators 9 intervening between adjacent annular sections of the front electrode 8.

Such insulating layers may be formed by coating the peripheral surfaces of the annular sections 81 to 85 with insulating polymer or paint solution. Conventional screen printing technique may advantageously be used for such surface coating. As an alternative, a thin disc may be made up or annular electrode section plates combined together by insulating polymer and pressed against the front surface of the precursor 7 for voltage application. In order to make such a thin disc, parts in the material front electrode corresponding to the insulators 9 in the complete front electrode 8 are cut out into annular gooves by etching etc., insulating material in solution or molten state is filled into the grooves for subsequent solidification, and the rear side surface of the front electrode is removed by cutting or polishing until the insulators appear on that surface.

The odd number annular sections 81, 83 and 85 are connected to the rear electrode 6 via an electric power source +V whereas the even number annular sections 82 and 84 are also connected to the rear electrode 6 via an electric power source −V. In this way, the precursor 7 is provided with annular sections 71, 72, 73, 74 and 75 which are alternately polarized in different, i.e. opposite, directions as shown with the arrows.

Figure 7B:
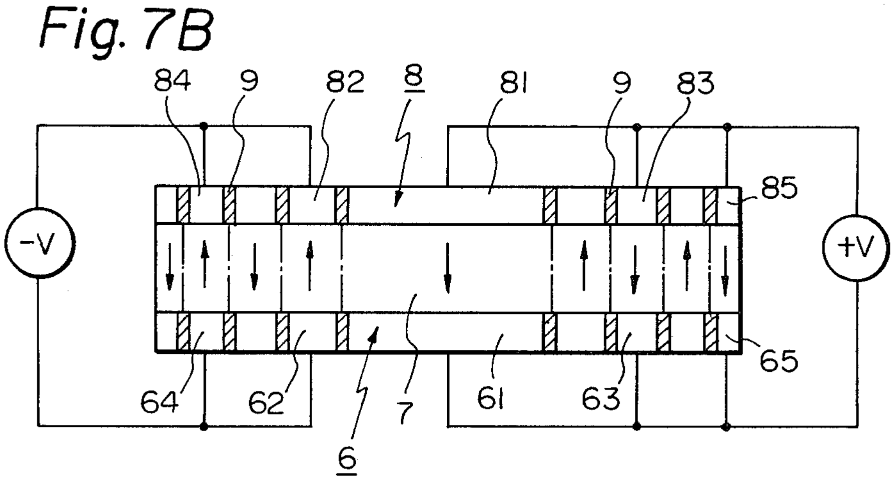

A modification of the inverse polarization type transducer element, i.e. the fourth embodiment of the present invention, is shown in FIG. 7B in which the rear electrode 6 is also provided with concentrically arranged annular sections 61, 62, 63, 64 and 65 separated by intervening annular insulators 9. Here, an annular section 6k (k=1, 2, 3, 4 and 5) of the rear electrode 6 fully meets in contour a corresponding annular section 8k of the front electrode 8. The odd number section of the front electrode 8 are connected to the corresponding odd number sections of the rear electrode 6 via an electric power source +V whereas the even number sections of the front electrode 8 are connected to the corresponding even number sections of the rear electrode 6 via an electric power source −V. In this way, just like the fourth embodiment, the precursor 7 is provided with annular sections 71, 72, 73, 74 and 75 which are alternately polarized in different, i.e. opposite, directions as shown with up and down arrows.

In this case, the potential difference between adjacent sections of the front electrode is one half of that in the arrangement shown in FIG. 7A and such reduced potential difference causes no dielectric breakdown and electrical discharge between the adjacent sections, thereby enabling correct and exact application of voltage to the piezoelectric element.

By application of voltage, the precursor 17 forms a piezoelectric film having sections alternately polarized in opposite directions so that the transducer element emanates ultrasonic waves to be focussed upon the imaginary focus point or line F.

EXAMPLES

The following examples are illustrative of the present invention but are not to be construed as limiting the same.

EXAMPLE 1

Figure 8:
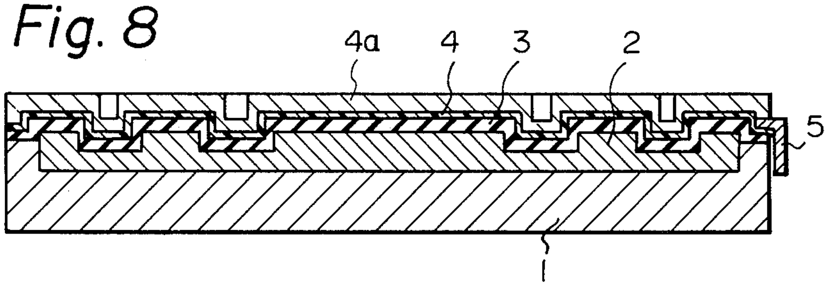
FIG. 8 is a side sectional view of the focus-type ultrasonic transducer element prepared in Example 1 of the present invention.

A focus-type ultrasonic transducer element of the first group was prepared as shown in FIG. 8. The construction of the transducer element is substantially same as that shown in FIGS. 4A and 4B.

The substrate 1 was made of polymethyl methacrylate and its acoustic impedance Z was about $3.2\times10^6$ kg/m²·s. A rear electrode 2 made of a Cu plate was bonded to the substrate 1 by means of epoxy resin. After polarization at 120° C. for 1 hour within an electric field of $10^6$ V/cm, a uniaxially oriented polyvinylidene fluoride piezoelectric film 3 of 90 μm thickness was bonded to the front surface of the rear electrode 2 by means of a cyanoacrylate bonding agent. The Al electrode formed during the polarization perse was used as a front electrode 4 to which a lead was coupled by means of a Cu foil 5. The Al front electrode 4 was further fully covered with a polyethylene terephthalate film 4a of 15 μm thickness for surface protection.

The Cu-plate used for the rear electrode 2 was 17 mm. in diameter and 300 μm in thickness. Salient and hollow sections were formed by etching so that the height ΔH between the salient and hollow sections was 150 μm. The center salient section was 3.9 mm in radius and five sections were formed in concentric arrangement.

The transducer element of the above-described construction was driven at 5 MHz frequency over the entire surface while using water as the acoustic transmission medium and it was confirmed that ultrasonic waves were focussed upon a focus point at a position of 5 cm in front of the transducer element.

The integral one piece construction of the rear electrode enabled simplified electric drive of the transducer element and simplified electric connection. Transmission of ultrasonic waves could be carried out only by application of drive voltage between the front and rear electrodes. These advantages in operation caused easier manufacturing, uniform function over the entire sections of the transducer element, and lower manufacturing cost.

EXAMPLE 2

Figure 9:
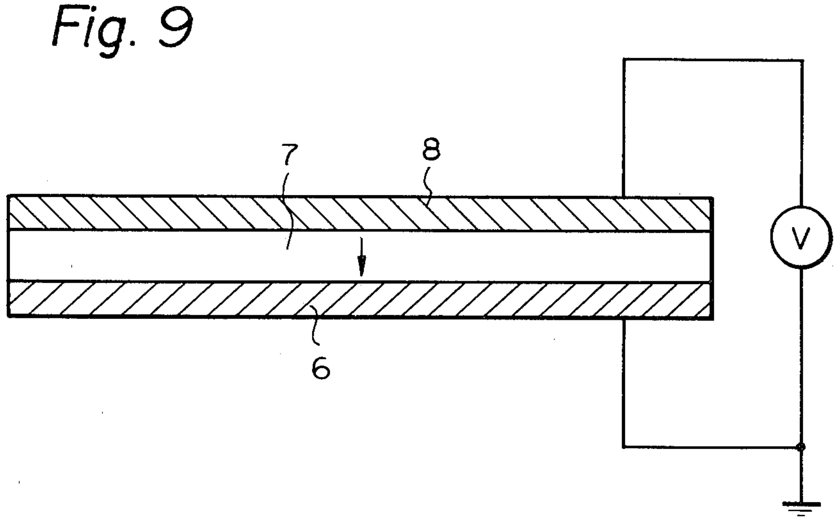
FIG. 9 is an explanatory side elevational view of the transducer element unit prepared in Example 2 of the present invention.
Figure 10:
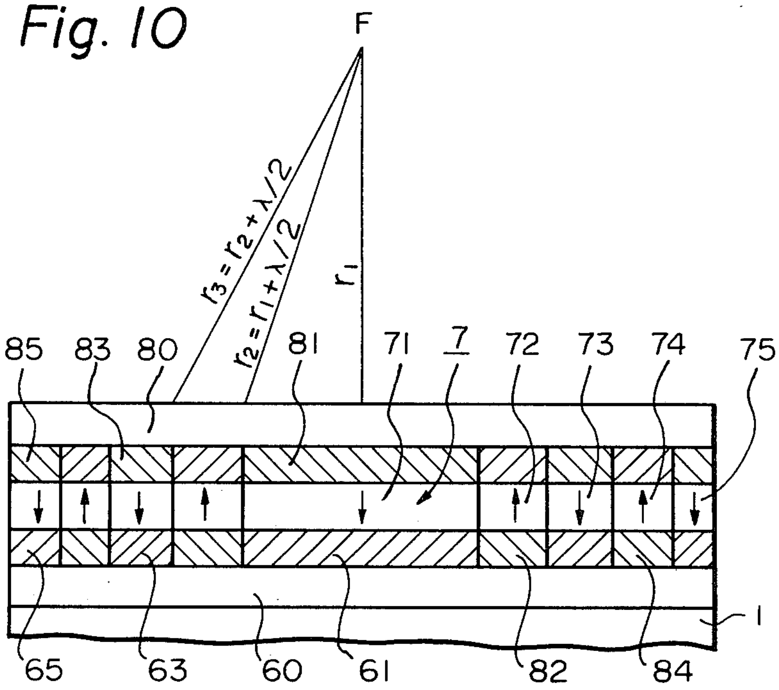
FIG. 10 is an explanatory side sectional view of an ultrasonic transducer element including the unit shown in FIG. 9.

A focus-type ultrasonic transducer element of the second group was prepared as shown in FIGS. 9 and 10.

In the first place, a material transducer element was prepared as shown in FIG. 9, which includes a uniaxially oriented polyvinylidene fluoride piezoelectric film 7 of 90 μm thickness, a Cu-plate rear electrode 6 of 12 μm thickness and an Al front electrode 8 of 1 μm thickness. By application of voltage at 120° C. for 1 hour within an electric field of $10^6$ V/cm., the piezoelectric film 7 was polarized in a same direction as shown with an arrow. Concentric rings including annular sections 71, 72, 73, 74 and 75 were cut out from the material transducer element and re-combined together to form a transducer element unit as shown in FIG. 10, in which adjacent annular sections are opposite in direction of polarization as shown with arrows.

The transducer element included an Al front electrode 80 of 7 μm thickness disposed to the front surface of the above-described transducer element unit, a Cu rear electrode 60 of 150 μm thickness bonded to the rear surface of the transducer element unit by means of cyanoacrylate, and a polymethyl methacrylate substrate 1 whose acoustic impedance is smaller than that of the piezoelectric film 7. Because of relatively low conductivity caused by thin construction, the original electrodes 6 and 8 may be removed from the concentric rings cut out from the material transducer element before re-combination into the transducer element unit.

The transducer element of the above-described construction was driven at 5 MHz frequency over the entire surface while using water as the acoustic transmission medium and it was confirmed that ultrasonic waves were focussed upon a focus point at a position of 5 cm in front of the transducer element, and that ultrasonic waves from adjacent annular sections of the piezoelectric film were fully in phase at the focus point.

Due to the relatively soft and flexible nature of the polymer piezoelectric film, cutting out of the concentric rings may be carried very easily without the occurrence of any crack and breakage as are encountered when inorganic piezoelectric elements are used.

We claim:

1. An ultrasonic transducer element, comprising:

a polymer piezoelectric film divided into a plurality of sections corresponding generally to adjacent fresnel zones, said plurality of sections being concentrically arranged annular sections;

electrodes arranged on opposing surfaces of said piezoelectric film for exciting said sections to emit ultrasonic waves of the same frequency and phase in response to an electrical signal supplied to said electrodes; and said sections being sized, shaped and positioned so that said ultrasonic waves from said plurality of sections arrive at a focal point removed from said piezoelectric film, substantially in phase; said sections being alternately arranged as salient and hollow sections, the distance between the surface of said salient and hollow sections facing said focal point being approximately equal to one-half wavelength of said ultrasonic waves.

2. An ultrasonic transducer element, comprising:

a polymer piezoelectric film divided into a plurality of sections corresponding generally to adjacent fresnel zones;

electrodes arranged on opposing surfaces of said piezoelectric film for exciting said sections to emit ultrasonic waves of the same frequency and phase in response to an electrical signal supplied to said electrodes; and said sections being sized, shaped and positioned so that said ultrasonic waves from said plurality of sections arrive at a focal point removed from said piezoelectric film, substantially in phase; first alternative ones of said plurality of sections being disposed in a first plane, and second alternative ones of said plurality of sections being disposed in a second plane, said first plane being parallel to said second plane and being disposed from said second plane by a distance substantially equal to one-half wavelength of said ultrasonic waves as measured along a direction perpendicular to said first and second planes.

3. An ultrasonic transducer element, comprising:

a polymer piezoelectric film divided into a plurality of sections corresponding generally to adjacent fresnel zones, said plurality of sections being parallel rectangular sections;

electrodes arranged on opposing surfaces of said piezoelectric film for exciting said sections to emit ultrasonic waves of the same frequency and phase in response to an electrical signal supplied to said electrodes; and said sections being sized, shaped and positioned so that said ultrasonic waves from said plurality of sections arrive at a focal point removed from said piezoelectric film, substantially in phase; said focal point forming part of a focal line along which said ultrasonic waves are focused and wherein said sections are sized, shaped and positioned so that said ultrasonic waves arrive at said focal line substantially in phase; first alternative ones of said plurality of sections being disposed in a first plane, second alternative ones of said plurality of sections being disposed in a second plane, said first plane being parallel to said second plane and displaced from said second plane by a distance substantially equal to one-half wavelength of said ultrasonic waves as measured along a direction perpendicular to said first and second planes.

4. An ultrasonic transducer element, comprising:

a polymer piezoelectric film divided into a plurality of sections corresponding generally to adjacent fresnel zones, said plurality of sections being concentrically arranged annular sections;

electrodes arranged on opposing surfaces of said piezoelectric film for exciting said sections to emit ultrasonic waves of the same frequency and phase in response to an electrical signal supplied to said electrodes; and said sections being sized, shaped and positioned so that said ultrasonic waves from said plurality of sections arrive at a focal point removed from said piezoelectric film, substantially in phase; first alternative ones of said plurality of sections being disposed in a first plane, and second alternative ones of said plurality of sections being disposed in a second plane, said first plane being parallel to said second plane and displaced from said second plane by a distance substantially equal to one-half wavelength of said ultrasonic waves as measured along a direction perpendicular to said first and second planes.

5. An ultrasonic transducer element, comprising:

a polymer piezoelectric film divided into a plurality of sections corresponding generally to adjacent fresnel zones, said plurality of sections being concentrically arranged annular sections;

electrodes arranged on opposing surfaces of said piezoelectric film for exciting said sections to emit ultrasonic waves of the same frequency and phase in response to an electrical signal supplied to said electrodes; and said sections being sized, shaped and positioned so that said ultrasonic waves from said plurality of sections arrive at a focal point removed from said piezoelectric film, substantially in phase; an innermost one of said plurality of annular sections having a surface contour defined by a sphere of predetermined radius, said sphere having a center disposed at said focal point, and said surface contour of each successive one of said annular sections also being defined by a respective sphere whose center is disposed at said focal point and whose radius is one said wavelength greater than the radius of the next innermost annular portion.

6. An ultrasonic transducer element as claimed in claim 5, in which said sections are delineated by relatively round border areas.

* * * * *